(12) United States Patent
Tsai

(10) Patent No.: US 7,281,573 B2
(45) Date of Patent: Oct. 16, 2007

(54) COOLER

(75) Inventor: Ming-Kun Tsai, Yunglin Hsien (TW)

(73) Assignee: Hua-Hsin Tsai, Hsinchu County (TW)

( * ) Notice: Subject to any disclaimer, the term of this patent is extended or adjusted under 35 U.S.C. 154(b) by 138 days.

(21) Appl. No.: 11/302,397

(22) Filed: Dec. 14, 2005

(65) Prior Publication Data
US 2007/0131406 A1    Jun. 14, 2007

(51) Int. Cl.
*F28F 7/00* (2006.01)
(52) U.S. Cl. .................. 165/185; 165/80.3; 165/146
(58) Field of Classification Search .......... 165/185, 165/80.2, 80.3, 146, 147; 361/697
See application file for complete search history.

(56) References Cited

U.S. PATENT DOCUMENTS

| | | | | |
|---|---|---|---|---|
| 5,285,350 A | * | 2/1994 | Villaume | 165/80.3 |
| 5,727,624 A | * | 3/1998 | Ko et al. | 165/80.3 |
| 6,374,490 B1 | * | 4/2002 | Miyahara | 29/890.03 |
| 6,549,404 B1 | * | 4/2003 | Kitahara et al. | 165/121 |
| 6,913,070 B2 | * | 7/2005 | Wang et al. | 165/80.3 |
| 2005/0039882 A1 | * | 2/2005 | Griesmayer | 165/80.3 |
| 2005/0280996 A1 | * | 12/2005 | Erturk et al. | 361/700 |

* cited by examiner

*Primary Examiner*—Teresa J. Walberg
(74) *Attorney, Agent, or Firm*—Rosenberg, Klein & Lee

(57) ABSTRACT

A cooler includes a heat conducting member and a heat scattering member. The heat conducting portion is closely attached with a heat source. The heat scattering member has plural hollow cones respectively formed of sintered metallic particles with their size enlarged gradually from the bottom to the top. The metallic particles closer to the surface of the heat conducting member are smaller, having a greater contact area to transmit the heat more effectively. And, plus the ventilation of a fan on the heat scattering member, the air in the hole of the hollow cone is expelled out, so the air outside the hollow cone flows into its center through the porosities between the metallic particles, enabling the metallic particles of the hollow cone to increase the contact area with air for a better thermal release.

3 Claims, 3 Drawing Sheets

COOLER

BACKGROUND OF THE INVENTION

1. Field of the Invention

This invention relates to a cooler, particularly to one whose heat scattering member on its heat conducting member is provided with plural hollow cones respectively formed of sintered metallic particles.

2. Description of the Prior Art

A central processing unit (CPU) is the primary and the most important component in a computer. When a computer is booted, the CPU reads various instructions or information from a memory and then, makes them processed by an arithmetic logic unit to obtain new data that are restored back to the memory. By the time, in communication with a motherboard and peripheral devices, data processing is completely achieved. In other words, all jobs in a computer must be processed by a CPU, so the whole efficiency of a computer depends on the processing speed of the CPU. But the faster the CPU speeds up, the more the heat is generated by the CPU. Unfortunately, heat will retard the processing of the CPU, even crash the computer or burn out the CPU. In order to release the heat generated by the CPU, a cooler fixed on the CPU is used to scatter the heat. As shown in FIG. 1, a common conventional cooler 91 for a CPU 92 is tightly attached with the CPU 92. The cooler 91 mainly includes a flat plate 911 and plural fins 912 arrayed on the flat plate 911 with an equal interval. A fan 93 is fixed on the fins 921 for supplying a ventilation to scatter the heat generated by the CPU and transmitted via the flat plate 911 through the fins 921, so as to keep the CPU from thermal damage. But, because the thin fins 912 are arrayed equidistantly, the convectional ventilation can merely keep the air moving from the bottom to the top, making a limited collision between the air and the fins 921, unable to provide a satisfied thermal scattering. Moreover, if a computer should be interrupted by excessive heat of the CPU, data might be lost, to resulting in waste of time and embarrassment of a user.

SUMMARY OF THE INVENTION

The prime object of this invention is to offer a cooler for a central processing unit (CPU).

The main characteristics of the invention are a heat conducting member and a heat scattering member. The heat conducting portion is to be closely attached with a heat source. The heat scattering member is provided with plural hollow cones respectively formed of sintered metallic particles with its particle size enlarged gradually from the bottom—the surface of the heat conducting member—to the top. Since the metallic particles closer to the surface of the heat conducting portion are smaller, they have a greater contact area so as to transmit the heat more effectively. And, plus the ventilation of a fan on the heat scattering portion, the air in the center of the hollow cone is to be expelled out, so that the air outside the hollow cone is to flow into its center through the porosities between the metallic particles, enabling the metallic particles of the hollow cone to increase contact area with the air for a better thermal release.

BRIEF DESCRIPTION OF DRAWINGS

This invention is better understood by referring to the accompanying drawings, wherein.

DETAILED DESCRIPTION OF THE PREFERRED EMBODIMENT

Figure 1:
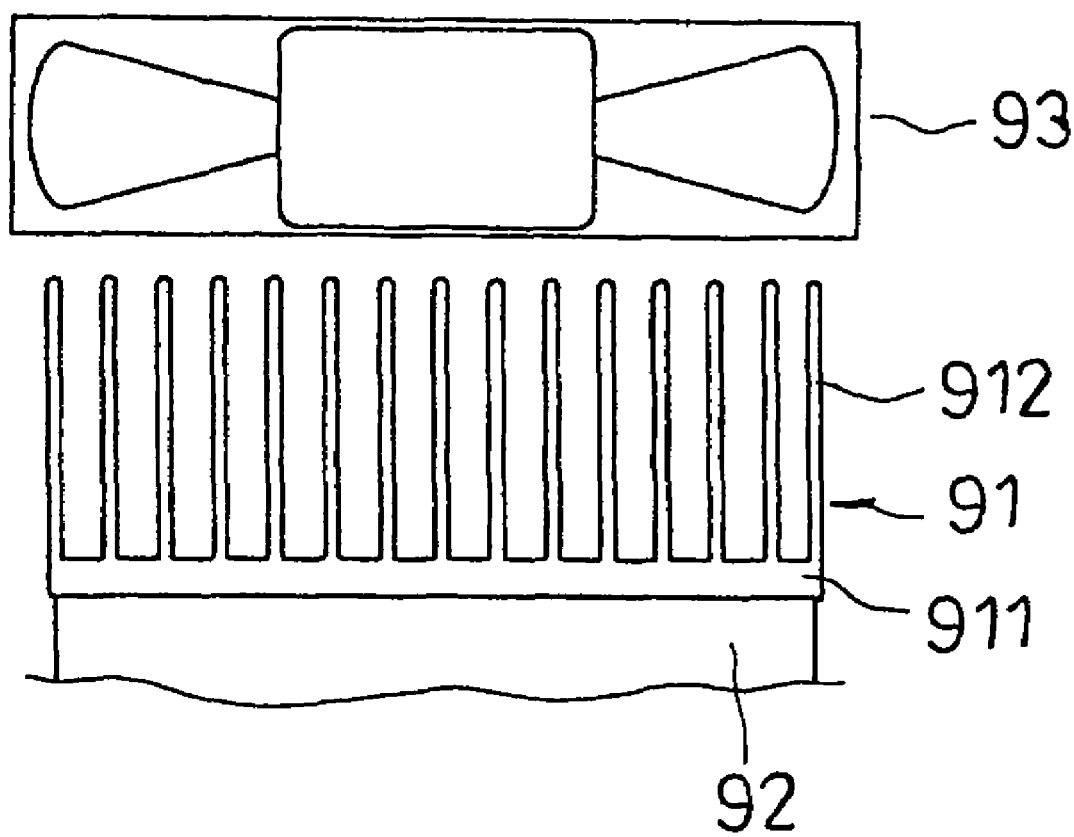
FIG. 1 is an illustrative perspective view of a conventional cooler.
Figure 2:
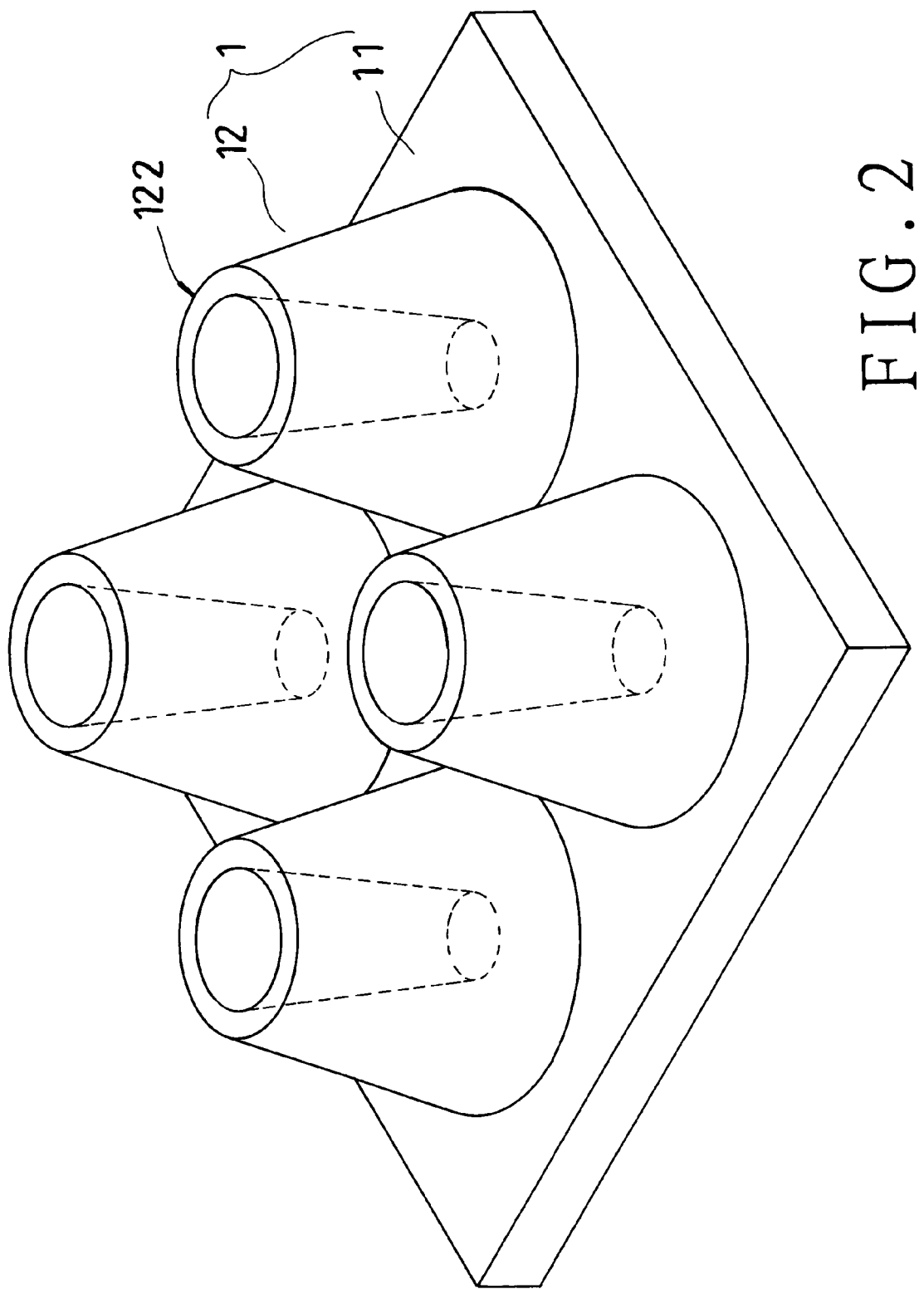
FIG. 2 is a perspective view of a preferred embodiment of a cooler in the present invention.
Figure 3:
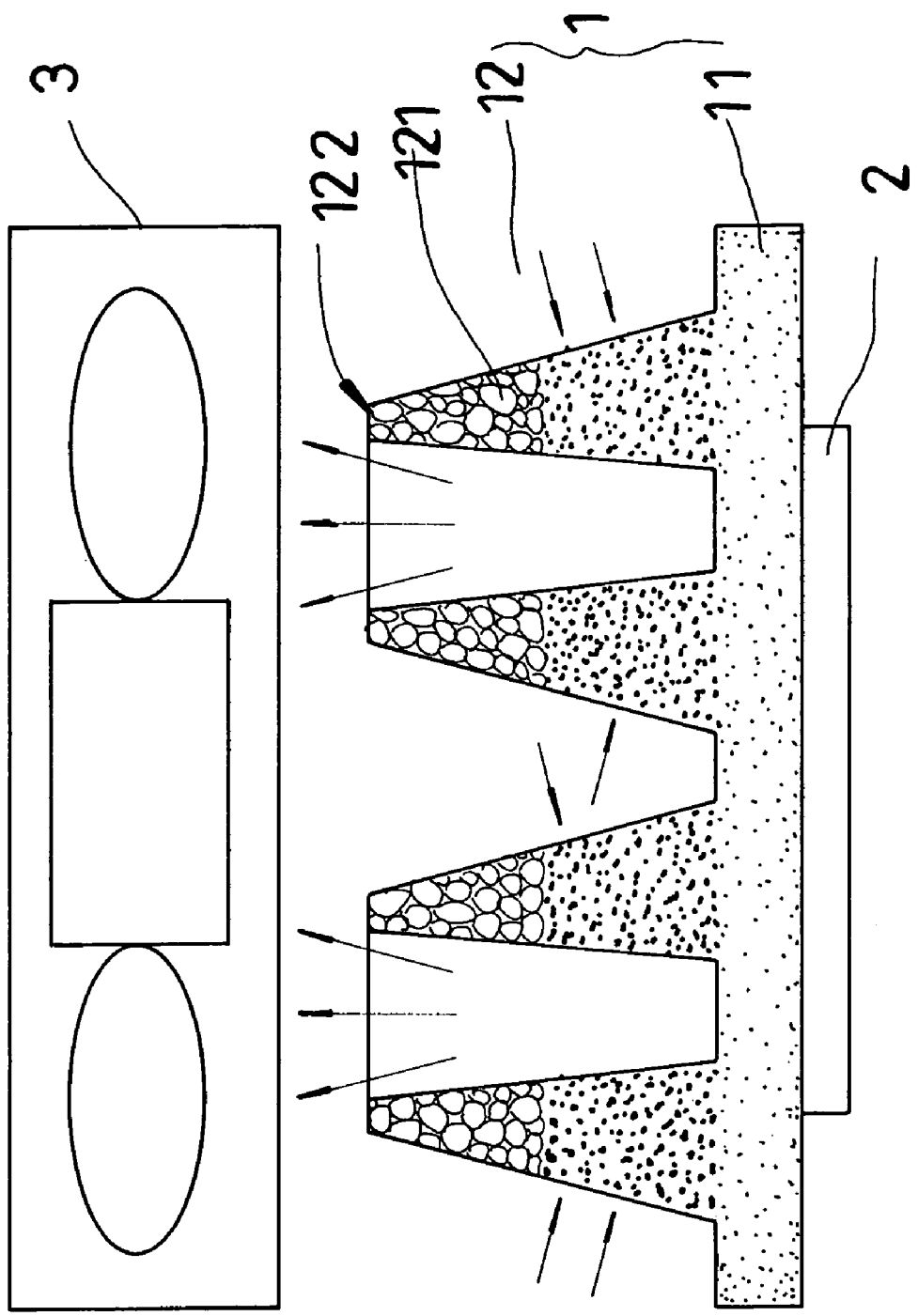
FIG. 3 is a cross-sectional view of the preferred embodiment of a cooler in the present invention.

As shown in FIGS. 2 and 3, a first preferred embodiment of a cooler 1 in the present invention is placed on a heat source 2. The cooler 1 includes a heat conducting member 11 and a heat scattering member 12 set on the heat conducting portion 11.

The heat conducting member 11 is formed of a flat plate able to be closely attached with the heat source 2.

The heat scattering portion 12 consists of plural hollow cones 122 that are respectively formed of sintered metallic particles 121, having a good heat conductivity, with its particle size enlarged gradually from the bottom—the surface of the heat conducting member 11—to the top. And, the diameter of the central hole is gradually enlarged from the bottom to the top as well.

In using, as shown in FIGS. 2 and 3, the flat heat conducting portion 11 of the cooler 1 is tightly attached with the heat source 2 and a fan 3 is fixed on the heat scattering member 12. Because the metallic particles 121 closer to the surface of the heat conducting member 11 are smaller, they have a greater contact area so as to transmit the heat in the heat conducting member 11 to the heat scattering member 12 more rapidly. And, plus the ventilation of the fan 3 on the heat scattering portion 12, the air in the hole of the hollow cone 122 is to be expelled out, so that the air outside the hollow cone 122 is to flow into its center through the porosities between the metallic particles 122, enabling the metallic particles 121 of the hollow cone 122 to increase contact area with air for a better thermal release.

The cooler in the present invention has the advantages described below:

1. The metallic particles 121 closer to the surface of the heat conducting portion 11 are smaller, they have a greater contact area with air so as to transmit the heat in the heat conducting member 11 to the heat scattering member more rapidly.
2. Via the ventilation of the fan 3, the air in the center of the hollow cone 122 is to be blown out, so that the air outside the hollow cone 122 is to flow into its center through the porosities between the metallic particles 122, enabling the metallic particles 121 of the hollow cone 122 to increase contact area with air for a better heat release.

While the preferred embodiment of the invention has been described above, it will be recognized and understood that various modifications may be made therein and the appended claims are intended to cover all such modifications that may fall within the spirit and scope of the invention.

What is claimed is:

1. A cooler comprising:
   a heat conducting member shaped as a flat plate; and,
   a heat scattering member located on said conducting portion and consisting of plural hollow cones; each said hollow cone formed of sintered particles with a particle size enlarged gradually from the bottom to the top.
2. A cooler as claimed in claim 1, wherein said particles are made of a good heat conductive metal.
3. A cooler as claimed in claim 1, wherein each said hollow cone has a diameter in its central hole enlarged gradually from the bottom to the top.

* * * * *